(12) United States Patent
Pecher et al.

(10) Patent No.: US 7,591,194 B2
(45) Date of Patent: Sep. 22, 2009

(54) DATA CAPTURING AND PROCESSING SYSTEM FOR A ROLLER BEARING AND ROLLER BEARING WITH SUCH SYSTEM

(75) Inventors: Alfred Pecher, Stadtlauringen (DE); Joachim Hering, Wurzburg (DE); Henry Van Der Knokke, Niederwerrn (DE); Walter Felber, Kaufbeuren (DE)

(73) Assignee: Schaeffler KG, Herzogenaurach (DE)

( * ) Notice: Subject to any disclaimer, the term of this patent is extended or adjusted under 35 U.S.C. 154(b) by 205 days.

(21) Appl. No.: 10/574,029

(22) PCT Filed: Sep. 17, 2004

(86) PCT No.: PCT/DE2004/002082

§ 371 (c)(1),
(2), (4) Date: Apr. 18, 2006

(87) PCT Pub. No.: WO2005/031296

PCT Pub. Date: Apr. 7, 2005

(65) Prior Publication Data

US 2007/0068218 A1    Mar. 29, 2007

(30) Foreign Application Priority Data

Sep. 24, 2003   (DE) ............................... 103 44 234

(51) Int. Cl.
*G01L 3/14* (2006.01)
(52) U.S. Cl. ................................. 73/862.322
(58) Field of Classification Search ............ 73/862.322; 438/106, 113; 29/837, 840
See application file for complete search history.

(56) References Cited

U.S. PATENT DOCUMENTS

| | | | |
|---|---|---|---|
| 3,963,285 A * | 6/1976 | Kellstrom | 384/450 |
| 4,433,580 A * | 2/1984 | Tward | 73/718 |
| 5,090,246 A * | 2/1992 | Colla et al. | 73/718 |
| 5,150,759 A * | 9/1992 | Borchard | 177/210 C |
| 5,195,830 A * | 3/1993 | Caillault et al. | 384/448 |
| 5,267,221 A * | 11/1993 | Miller et al. | 367/140 |
| 5,350,916 A * | 9/1994 | Bierhoff et al. | 250/214.1 |
| 5,594,334 A * | 1/1997 | Sonnerat et al. | 324/173 |
| 5,873,658 A * | 2/1999 | Message et al. | 384/448 |
| 5,986,459 A * | 11/1999 | Fukaya et al. | 324/755 |
| 6,151,967 A * | 11/2000 | McIntosh et al. | 73/514.32 |
| 6,535,135 B1 * | 3/2003 | French et al. | 340/682 |
| 6,658,947 B1 * | 12/2003 | Sendzimir et al. | 73/862.451 |
| 6,948,856 B2 * | 9/2005 | Takizawa et al. | 384/448 |

(Continued)

FOREIGN PATENT DOCUMENTS

DE        4218949 A1    12/1993

(Continued)

*Primary Examiner*—Lisa M Caputo
*Assistant Examiner*—Octavia Davis
(74) *Attorney, Agent, or Firm*—Lucas & Mercanti, LLP

(57) ABSTRACT

The invention relates to a data capture system and to a processing system (1) for a roller bearing, wherein at least one sensor element (19), conductor strips (4) and electronic components (5, 6) are arranged adjacent to a flexible carrier material (2). The sensor element (19), the conductor strips (4) and the electronic components (5, 6) are directly connected to the flexible carrier material (2) such that said type of data capture system and data processing system (1) can be produced in an economical manner and with varying applications.

25 Claims, 2 Drawing Sheets

U.S. PATENT DOCUMENTS

| | | |
|---|---|---|
| 7,010,081 B2 * | 3/2006 | Brunnett et al. ............... 378/15 |
| 7,034,711 B2 * | 4/2006 | Sakatani et al. .......... 340/686.1 |
| 2002/0092360 A1 | 7/2002 | McDearmon |

FOREIGN PATENT DOCUMENTS

| | | |
|---|---|---|
| DE | 29507357 U1 | 7/1995 |
| DE | 19747001 A1 | 5/1999 |
| DE | 29922560 U1 | 3/2000 |
| DE | 10304592 A1 | 8/2004 |
| DE | 10335690 A1 | 12/2004 |

* cited by examiner

DATA CAPTURING AND PROCESSING SYSTEM FOR A ROLLER BEARING AND ROLLER BEARING WITH SUCH SYSTEM

FIELD OF THE INVENTION

The invention relates to a data capturing and processing system for a roller bearing according to the preamble of patent claim 1 and to a roller bearing with such a system.

BACKGROUND OF THE INVENTION

DE 101 36 438 A1 discloses a sensor arrangement in a roller bearing which is suitable for determining physical variables during the movement of a component mounted in the roller bearing. In the case of the sensor arrangement, the forces and moments acting on the bearing shells of the roller bearing are captured by sensor elements and electronic devices that are attached to the bearing shells being used to detect mechanical stresses or other physical reactions of the bearing shells to these forces and moments. The sensor elements are in this case formed as resistive strain gages, which are preferably fastened in a groove at the periphery of the fixed bearing shell, it being possible for the latter to be both the inner bearing shell or the outer bearing shell of a roller bearing.

According to this publication, the resistive strain gages may be applied over an insulating layer on a metal intermediate carrier, such as for example a small plate. A further carrier material, formed as a leadframe, surrounds said intermediate carrier with the resistive strain gages and serves for receiving electronic devices and strip conductors. To fasten the intermediate carrier and the leadframe to the bearing shell, they are pressed or welded into the groove of the same.

In addition, it is known from this DE 101 36 438 A1 that the resistive strain gages can be applied to the metal intermediate carrier in the form of an axially and tangentially measuring full-bridge or half-bridge connection. Moreover, this publication discloses that, with the electronic devices, a signal evaluation and signal transmission to further measuring points or other evaluation circuits or to a connection plug takes place. The signal transmission in the case of this known measuring bearing may take place serially via a digital or analog bus system, which is arranged for example in a motor vehicle.

Although this known measuring bearing has a comparatively high and advantageous degree of integration on account of the arrangement of sensor elements and electronic devices in the groove of the bearing ring, a relatively wide groove is required for its construction. Since, however, the groove in such a bearing ring is to be kept as small as possible to avoid weakening of the component, conversion of the arrangement known from DE 101 36 438 A1 into a marketable product is not very likely. The technical problem described occurs in particular in the case of roller bearings that are axially very narrow.

Furthermore, the applicant's DE 103 04 592 A1, which is not a prior publication, discloses a measuring bearing in which the strain gages, the electrical conductors and/or the electronic devices are sputtered directly onto the surface of the recess of the bearing ring or onto the silicon dioxide layer.

Although the construction of the measuring bearing according to the last-mentioned, not previously published DE 103 04 592 A1 is accompanied by distinct advantages over the prior art cited at the beginning with regard to the compactness of a measurement data capturing and processing system formed on a roller bearing, there is a demand for a variant which can be produced at still lower cost. For example, the preparation of the surface for fastening the system to a bearing ring is complex and expensive, since it has to be precise and clean.

SUMMARY OF THE INVENTION

Against this background, the object for the invention is to present a measurement data capturing and processing system for a roller bearing and an associated measuring roller bearing which has a compact construction and can be produced at low cost. The preparation and fastening of the sensor arrangement on the bearing are to be simplified in particular.

The solution achieving this object is obtained from the features of the main claim and from the features of the dependent claims.

Accordingly, the invention relates to a measurement data capturing and processing system for a roller bearing in which at least one sensor element, strip conductors and electronic components are arranged adjacent a flexible carrier material.

Sensor elements are, for example, the known strain gages with conductors, for example of nickel-chromium, and other resistance elements or strip conductors of copper that are specially produced and known per se, which according to one refinement of the invention are interconnected in the manner of a resistance bridge. Such resistance bridges may be applied to flexible carrier objects in strip form or else directly to the flexible carrier material.

A further refinement of the invention provides one or more capacitors as sensor elements. The basic construction of the sensors is similar to the construction of a plate capacitor. Conductor areas or metal foils applied to the carrier material over large surface areas as "capacitor plates" are separated from one another by the flexible carrier material as a dielectric. An alternative here is also that a number of areas/foils or capacitors are connected in series.

The conductor areas on one side of the carrier material can be at least partially elastically deformed by the influences to be captured from the roller bearing in the direction of the opposite areas/foils to the extent that the distance between the areas/foils opposite one another, and with it the capacitance of the capacitor/capacitors, changes. The influences from the roller bearing are, for example, elastic deformations of a bearing ring from the rolling contact of the rolling bodies with the bearing ring. The elastic deformations of the ring are transferred to the elastic areas of the capacitor, so that the change in the capacitance is an assessment criterion for the elastic deformation in the bearing ring.

Alternatively, the elastically deforming surface of the roller bearing component forms one plate of the capacitor, which is then connected on one side of the carrier material to the carrier material, for example by means of a very thin and elastic layer of adhesive. On the other side of the correspondingly thin and elastic carrier material, one or more of the plates of the capacitor is or are then arranged in the form of the conductor areas or foils. Plated through holes through the carrier material are not required in the case where capacitors are used as sensor elements.

The sensor elements, the strip conductors and the electronic components are directly connected to the flexible carrier material on the side facing away from the roller bearing component—that is on top, but preferably underneath. This is not already known from DE 103 04 592 A1, since in the case of the latter the strain gages are applied to an insulating substrate which is applied directly to a roller bearing component.

In comparison with this prior art, the invention offers a series of advantages. For instance, the described construction allows the measurement data capturing and processing system together with all the sensor elements to be produced as a complete unit in a protected environment and subsequently connected to the respective roller bearing. As a result, already before connection to the roller bearing, there is the possibility of testing the functional capability of the measurement data capturing and processing system, making changes to it or not using it any further as it is what is known as a reject. Furthermore, since the sensor elements are not directly applied to the surface of the roller bearing component, not costly preparations of the surface are required.

A further advantage is that, with a releasable connection between a roller bearing component and the measurement data capturing and processing system, in the event of a defect said system can easily be removed and replaced by one which is operational, without complex work on the roller bearing being necessary. This is of commercial significance in particular in the case of large roller bearings. This replacement system may, for example, also be one with which different measurements can be carried out.

It should be mentioned as a further advantage that the application of sensor elements, strip conductors and electronic components to a carrier material lying flat on an underlying surface is much less costly than production steps of this type on curved surfaces, so that, along with improved functionality in comparison with the prior art, production costs can be saved.

According to a preferred embodiment of the invention, it is provided that the sensor elements are fastened on the underside, and the strip conductors and the electronic components are fastened on the upper side of the flexible carrier material. As an alternative to this, it is provided that the electronic components and the strip conductors are arranged on the underside and the sensor elements are arranged on the upper side of the carrier material.

To pass on the deformation-induced changes in resistance determined by the sensor elements, they are connected by signaling technology via contacting elements, either by means through-hole plating elements to the strip conductors arranged on the opposite side of the flexible carrier material, or to adjacent electronic devices by means of conductor areas/paths. The through-hole plating elements are preferably formed in the flexible carrier material and aligned perpendicularly in relation to the longitudinal and transverse extents of said carrier material.

The sensor elements are preferably fastened on that side of the flexible carrier material which is facing the surface of that roller bearing component on which the data capturing and processing system is arranged.

A further aspect of the invention relates to the formation of the flexible carrier material, which preferably comprises a film or a number of films lying one on top of the other. This film or these films may in this case consist of a plastic or a thin and flexible metal foil. As an alternative to this, the film may be produced from modern materials, such as ceramic. If a plastic is used, a polyimide is preferred.

The application of the sensor elements, the strip conductors and the electronic components to the flexible carrier material preferably takes place by means of a screen printing process, by vapor deposition or by depositing conducting, semiconducting and/or insulating materials. The special case of adhesively attaching separately produced sensor elements onto the flexible carrier material has already been mentioned of course.

In addition, it is also possible for the sensor elements, the strip conductors and/or the electronic components to be respectively formed on a separate flexible carrier material, which are connected to one another to form a common flexible carrier material.

With respect to the definition of the electronic components, it should not go unmentioned that they can be formed as discrete components such as resistors, capacitors and the like. In addition, these electronic components can also be formed as microprocessors or as complete microcomputers. It is important, however, that initially an input stage from at least one amplifier is connected to the sensor elements.

If the flexible carrier material is formed such that it is largely thin and flexible, it may be provided according to another development of the invention that the flexible carrier material has a greater mechanical rigidity in the region of the amplifier, a microprocessor or microcomputer than in adjacent regions. This may be realized for example by thicker carrier material at this point, or a reinforcement of the carrier material by material being applied or the like.

If the sensor elements are adhesively attached on the flexible carrier material, it may be provided according to another form of the invention that an adhesive is applied to the flexible carrier material for fastening the sensor elements and is covered with a protective film before the sensor elements are attached. This procedure is meaningful for example whenever the measurement data capturing and processing system is to be formed in such a variable manner that, depending on the application, differently formed sensor elements are to be used for measuring operations.

Moreover, it is meaningful to cover the surface of the sensor elements and of the strip conductors with an electrically insulating layer. This insulating layer may consist of a solder resist or is formed by the adhesive with which the system is fastened to the roller bearing component.

A further refinement of the invention provides that the electrical and electronic components as well as the insulating layers and the flexible carrier material, but also the sensor elements, at least partially consist of or are constructed from conducting, semiconducting and/or insulating polymers.

The measurement data capturing and processing system according to the invention is used with advantage on a roller bearing, the measurement data capturing and processing system being fastened in a recess or in a peripheral groove, or on a groove-less or recess-less annular area, on one of two roller bearing components which enclose rolling bodies between them. As is known, the inner ring and outer ring of a roller bearing are bearing components of this type. The measurement data capturing and processing system according to the invention is advantageously also used on linear bearings.

If the data capturing and processing system is fastened in a recess or groove on a roller bearing component, it is recommended to cover it with an encapsulating material if permanent, unchanged use of such a measuring roller bearing is meaningful and desired.

Finally, it should be mentioned that the measurement data capturing and processing system is fastened with advantage on the outer side of a housing flange on the inner wall of which rolling bodies roll.

BRIEF DESCRIPTION OF THE DRAWINGS

The invention can be explained in more detail on the basis of exemplary embodiments. In the drawing.

DETAILED DESCRIPTION OF THE DRAWINGS

Figure 1:
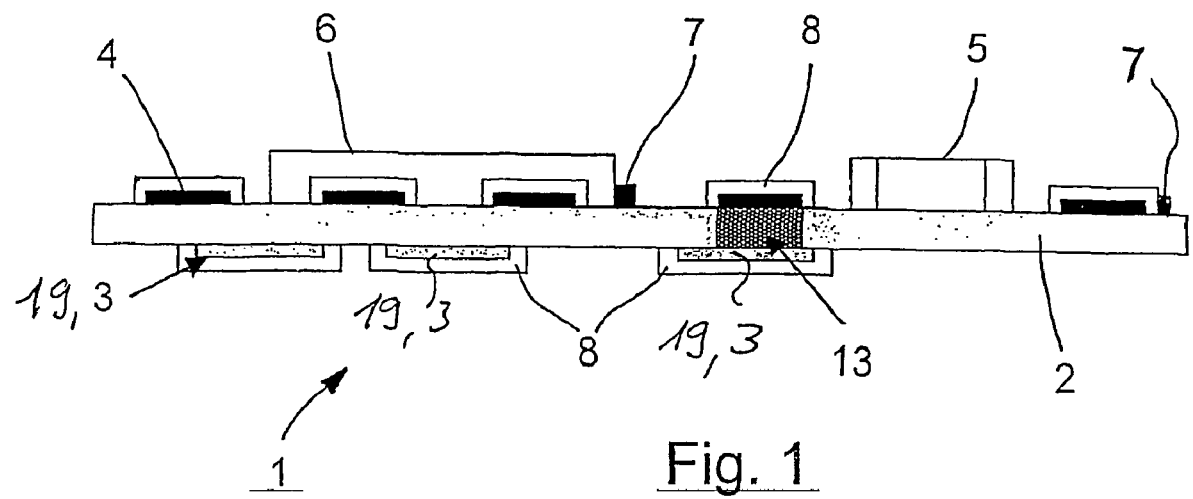
FIG. 1 shows a schematic cross section through the measurement data capturing and processing system formed according to the invention, with a strain gauge.

The representation in FIG. 1 shows a schematic cross section through a data capturing and processing system 1 formed according to the invention, the central component of which is a flexible carrier material 2, formed as a film. Located on the underside of this carrier material 2 are strain gages 3, which are arranged as sensor elements 19 and in this case are aligned into the place of the representation, but are alternatively also aligned in any desired directions, and in this specific exemplary embodiment are applied photolithographically but are alternatively also applied by means of screen printing. The underside of the flexible carrier material 2 is defined as that side which, with respect to fastening, faces in the direction of the roller bearing component on which the data capturing and processing system is arranged. In this case, the data capturing and processing system(s) is/are arranged for example on an inner periphery or outer periphery or on an end face of one or more inner or outer bearing rings or the like.

Moreover, it can clearly be seen in FIG. 1 that the free surfaces of the strain gages 3 are covered with an insulating material 8, which in this example consists of a solder resist or adhesive.

Arranged on the opposite upper side of the carrier material 2 are strip conductors 4, individual electronic components 5 and a microcomputer 6, it being possible for the individual electronic components 5 to be, for example, electrical resistors, capacitors and the like. These strip conductors 4, electronic components 5 and microcomputers 6 are applied to the carrier material 2 by one or various production technologies, the vapor deposition and/or application of conducting and semiconducting and/or insulating materials preferably being performed photolithographically but also alternatively by means of screen printing.

It is expressly not excluded in this connection that the electrical and electronic components as well as the insulating layers and the flexible carrier material consist of or are constructed from polymers.

As FIG. 1 also shows, the strip conductors 4 on the upper side of the flexible carrier material 2 are likewise covered with an insulating material 8. Moreover, formed at various points on the flexible carrier material 2 are electrical contact pads 7, which serve as connecting or soldering terminals for establishing an electrical connection between the electronic components 5 or the terminals of the microcomputer 6 and the strip conductors 4.

For the electrical connection of the strain gages 8 and at least some of the strip conductors 4 on the opposite side of the flexible carrier material 2, so-called through-hole plating elements 13 are arranged at suitable points in the same, extending substantially perpendicularly in relation to the longitudinal and transverse extents of the flexible carrier material 2. Through-hole plating elements of this type are, for example, electrical conductors of copper, with which plated through contact is established for the connection.

Figure 2:
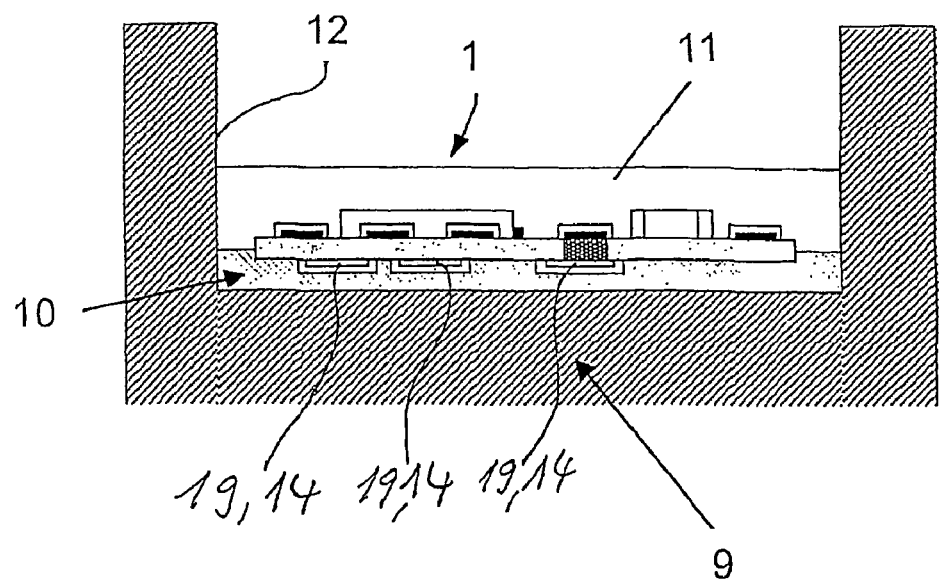
FIG. 2 shows a schematic cross section through a roller bearing outer ring and with a measurement data capturing and processing system fitted in a peripheral groove, with resistance bridges of copper.

A measurement data capturing and processing system 1 constructed in such a way can be fastened to a roller bearing comparatively simply. FIG. 2 shows in this respect, in an exemplary embodiment of the invention, that such a measurement data capturing and processing system 1 is fitted in a peripheral groove 12 of a roller bearing outer ring 9 and fastened on an adhesive layer 10 applied to the bottom of the groove. However, this adhesive 10 may also be applied similarly well on the underside of the flexible carrier material 2, covering the strain gages, before assembly begins.

As an alternative to the representation that is shown in FIG. 1, the sensor element 19 is formed by resistance bridges 14 with conductors of copper instead of the strain gages 3. The data capturing and processing system 1 on the flexible carrier material 2 is in this case arranged on the outer periphery of the bearing outer ring 9 in such a way that the resistance bridges 14 face in the direction of the rolling bodies (not represented here) of the roller bearing.

Finally, FIG. 2 shows that, in this exemplary embodiment, the measurement data capturing and processing system 1 is covered with an encapsulating compound 11, providing protection from mechanical and electrical influences.

Figure 3:
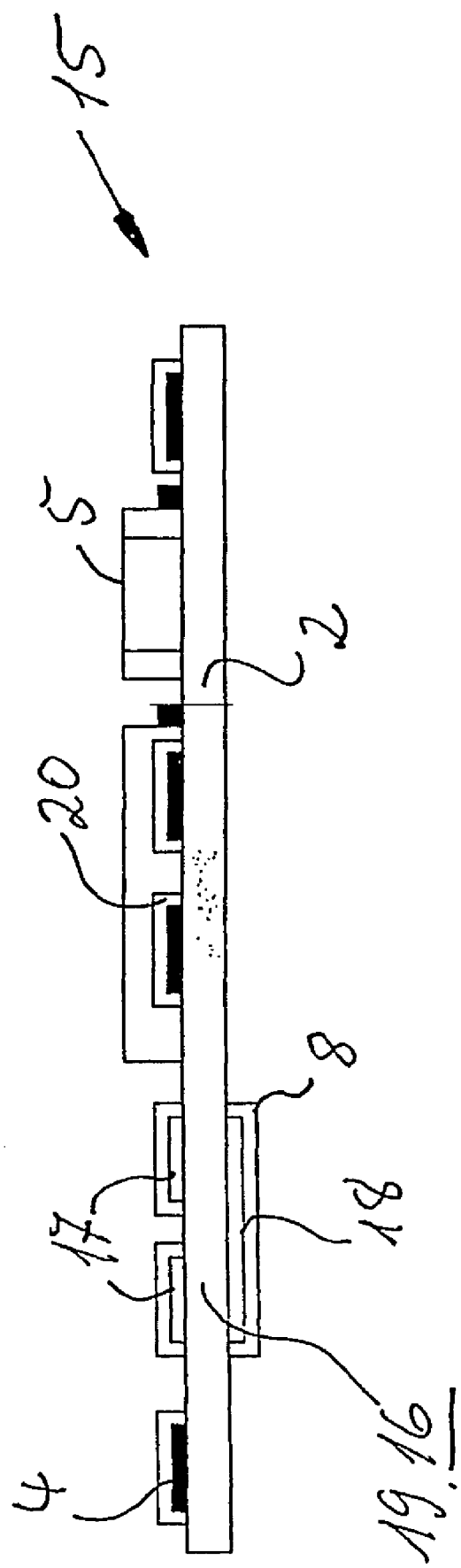
FIG. 3 shows a schematic cross section through a measurement data capturing and processing system formed according to the invention, with a capacitor.

FIG. 3 shows a data capturing and processing system 15, the sensor element 19 of which is formed by a plate capacitor 16. Arranged for this purpose on the upper side of the carrier material 2 are two capacitor plates connected in series in the form of conductor areas 17, which are formed such that they are relatively rigid. On the underside of the carrier material 2 facing toward the bearing (not represented), a further platelike conductor area 18 is fixed. In the same way as the carrier material 2, the conductor area 18 is formed from polyimide in the manner of a film and elastically, so that deformations from the bearing ring are transmitted through the conductor area 18 to the carrier material and, by means of the consequently changed distance between the conductor areas 17 and the conductor area 18, the capacitance of the plate capacitor 16 can be influenced as a measured value. An amplifier 20 is connected to the plate capacitor 16.

List of Designations

1 Data capturing and processing system
2 Carrier material
3 Strain gage
4 Strip conductor
5 Electronic component
6 Microcomputer
7 Contact pad with respect to the strip conductor
8 Insulating layer
9 Bearing outer ring
10 Adhesive material
11 Encapsulating material
12 Groove in the bearing outer ring
13 Contacting element
14 Resistance bridge
15 Data capturing and processing system
16 Plate capacitor
17 Conductor area
18 Conductor area
19 Sensor element
20 Amplifier

The invention claimed is:

1. A data capturing and processing system for a bearing comprising: at least one sensor element, strip conductors and electronic components arranged adjacent a flexible carrier material, the sensor element, the strip conductors and the electronic components are directly connected to the flexible carrier material and the sensor element is connected by signaling technology via contacting elements to the strip conductors, the contacting elements being formed in the flexible carrier material by means through-hole plating elements the sensor element being on one side of the flexible carrier material and the strip conductors being on the other side of the flexible carrier material.

2. The data capturing and processing system as claimed in claim 1, wherein the sensor element is fastened on the underside, and the strip conductors and the electronic components are fastened on the upper side of the flexible carrier material.

3. The data capturing and processing system as claimed in claim 1, wherein the strip conductors and the electronic components are fastened on the underside and the sensor element is fastened on the upper side of the carrier material.

4. The data capturing and processing system as claimed in claim 1, wherein the sensor element is at least one strain gage.

5. The data capturing and processing system as claimed in claim 1, wherein the sensor element is at least one at least partially elastically extensible resistance bridge with at least one conductor of copper.

6. The data capturing and processing system as claimed in claim 1, wherein the contacting elements are aligned perpendicularly in relation to the longitudinal and transverse extents of said carrier material or arranged in the manner of surface areas.

7. The data capturing and processing system as claimed in claim 1, wherein the sensor element is fastened on that side of the flexible carrier material which in the assembled state faces the surface of that roller bearing component on which the measurement data capturing and processing system is arranged.

8. The data capturing and processing system as claimed in claim 1, wherein the sensor element is fastened on that side of the flexible carrier material which in the assembled state faces the surface of that roller bearing component on which the measurement data capturing and processing system is fixed by means of adhesive material.

9. The data capturing and processing system as claimed in claim 1, wherein the flexible carrier material comprises a film or a number of films lying one on top of the other.

10. The data capturing and processing system as claimed in claim 1, wherein the flexible carrier material consists of a plastic or a thin and flexible metal foil.

11. The data capturing and processing system as claimed in claim 10, wherein the plastic is a polyimide.

12. The data capturing and processing system as claimed in claim 1, wherein the flexible carrier material is of ceramic.

13. The data capturing and processing system as claimed in claim 1, wherein the sensor element, the strip conductors and the electronic components are formed on the flexible carrier material by means of a screen printing process, by vapor deposition or deposition of insulating, conducting and/or semiconducting materials.

14. The data capturing and processing system as claimed in claim 1, wherein the sensor element, the strip conductors and/or the electronic components are respectively formed on separate flexible carrier materials, which are connected to one another to form a common flexible carrier material.

15. The data capturing and processing system as claimed in claim 1, wherein at least one of the electronic components is an amplifier.

16. The data capturing and processing system as claimed in claim 1, wherein the flexible carrier material has a greater mechanical rigidity, at least in the region of the amplifier.

17. The data capturing and processing system as claimed in claim 1, wherein the sensor element is adhesively attached on the flexible carrier material.

18. The data capturing and processing system as claimed in claim 1, wherein an adhesive material is applied to the flexible carrier material for fastening the sensor element and is covered with a pull-off protective film before the sensor element is attached.

19. The data capturing and processing system as claimed in claim 1, wherein the surface of the sensor element and of the strip conductors is covered with an electrically insulating layer.

20. The data capturing and processing system as claimed in claim 1, wherein the surface of the sensor element and of the strip conductors is covered with an electrically insulating layer and in that the insulating layer is a solder resist.

21. The data capturing and processing system as claimed in claim 1, wherein the surface of the sensor element and of the strip conductors is covered with an electrically insulating layer and in that the insulating layer is an adhesive material, the adhesive material being applied to that side of the flexible carrier material which in the assembled state faces the surface of that roller bearing component on which the measurement data capturing and processing system is fixed by means of the adhesive material.

22. The data capturing and processing system as claimed in claim 1, wherein the electrical and electronic components as well as the insulating layers and the flexible carrier material and also the sensor element at least partially consist of or are constructed from electrically insulating, semiconducting and/or conducting polymers.

23. A bearing with a data capturing and processing system as claimed in claim 1, wherein the data capturing and processing system is fastened in at least one recess or a peripheral groove, or on a groove-less or recess-less annular area, of at least one roller bearing component, the roller bearing component and at least one further roller bearing component enclosing rolling bodies between them.

24. The bearing with a data capturing and processing system as claimed in claim 1, wherein the data capturing and processing system is fastened in at least one recess or a peripheral groove, or on a groove-less or recess-less annular area at least on the outer side of a bearing outer ring.

25. The bearing with a data capturing and processing system as claimed in claim 1, wherein the data capturing and processing system is covered with an insulating encapsulating material.

* * * * *